(12) United States Patent
Choi et al.

(10) Patent No.: US 8,891,325 B2
(45) Date of Patent: Nov. 18, 2014

(54) CIRCUIT FOR DRIVING WORD LINE

(75) Inventors: Byeong Chan Choi, Icheon-si (KR); Gyung Tae Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 159 days.

(21) Appl. No.: 13/602,254

(22) Filed: Sep. 3, 2012

(65) Prior Publication Data

US 2013/0215697 A1    Aug. 22, 2013

(30) Foreign Application Priority Data

Feb. 21, 2012 (KR) .......................... 10-2012-0017448

(51) Int. Cl.
*G11C 8/08* (2006.01)

(52) U.S. Cl.
USPC .......................................................... 365/203

(58) Field of Classification Search
CPC .......................................................... G11C 8/08
USPC .......................................................... 365/203
See application file for complete search history.

(56) References Cited

U.S. PATENT DOCUMENTS

| | | | |
|---|---|---|---|
| 2005/0265110 A1* | 12/2005 | Kim ........................ | 365/230.06 |
| 2007/0223283 A1* | 9/2007 | Matsubara ............... | 365/185.23 |
| 2010/0174503 A1* | 7/2010 | Balch et al. ............... | 702/79 |
| 2011/0157968 A1* | 6/2011 | Em et al. ................. | 365/163 |
| 2011/0228624 A1* | 9/2011 | Kim et al. ................ | 365/230.06 |

FOREIGN PATENT DOCUMENTS

| | | |
|---|---|---|
| KR | 100894487 B1 | 4/2009 |
| KR | 100902052 B1 | 6/2009 |
| KR | 100933674 B1 | 12/2009 |

* cited by examiner

*Primary Examiner* — Hoai V Ho
*Assistant Examiner* — Min Huang
(74) *Attorney, Agent, or Firm* — William Park & Associates Patent Ltd.

(57) ABSTRACT

A word line driving circuit includes, inter alia: a word line driving signal generator, a main word line enable signal controller, and a sub word line driver. The word line driving signal generator activates a word line boosting signal, a pre-main word line enable signal, and a word line off signal in response to an active signal and a precharge signal. The main word line enable signal controller receives the pre-main word line enable signal and outputs it as the main word line enable signal in response to a main word line test mode signal. The sub word line driver uses the word line boosting signal as a driving voltage, and drives a sub word line in response to the main word line enable signal and the word line off signal.

13 Claims, 3 Drawing Sheets

CIRCUIT FOR DRIVING WORD LINE

CROSS-REFERENCES TO RELATED APPLICATION

The present application claims priority under 35 U.S.C. §119(a) to Korean application number 10-2012-0017448 filed on Feb. 21, 2012 in the Korean Intellectual Property Office, which is incorporated herein by reference in its entirety.

BACKGROUND

1. Technical Field

The present invention relates generally to a semiconductor memory apparatus, and more particularly, to a circuit for driving a word line.

2. Related Art

A semiconductor memory apparatus stores data in memory cells, where gates of the memory cells are controlled by word lines. Thus, the semiconductor memory apparatus includes a word line driving circuit for controlling the word lines.

Generally, a current word line driving circuit has a hierarchical structure for controlling a main word line via the sub word line. The hierarchical structure further refers to a scheme in which a plurality of sub word lines are assigned to one main word line, and adopts a pre-decoding concept. Thus, in order to activate a sub word line for selecting one memory cell, a corresponding main word line and a corresponding sub word line should also be selected.

FIG. 1a is a block diagram showing a conventional word line driving circuit.

The word line driving circuit includes a word line driving signal generator 1 and a sub word line driver 3.

The word line driving signal generator 1 receives an active signal ACT and a precharge signal PCG and generates a main word line enable signal MWLB, a word line boosting signal PX and a word line off signal PXB.

The sub word line driver 3 outputs a sub word line SWL using the word line boosting signal PX as a driving voltage in response to the main word line enable signal MWLB and the word line off signal PXB.

The main word line enable signal MWLB as a signal for selecting a main word line includes as many signals as the number of main word lines. In addition, the word line boosting signal PX and the word line off signal PXB, both needed to select a sub word line, include as many signals as the number of sub word lines assigned to a corresponding main word line. The word line off signal PXB may be generated by inverting the word line boosting signal PX. A plurality of main word lines and a plurality of sub word lines corresponding to a plurality of applied addresses are omitted and instead, one main word line and one sub word line selected by an active signal ACT and a precharge signal PCG are depicted in FIG. 1a. This configuration may be applied to all main word lines and sub word lines.

FIG. 1b is a circuit diagram illustrating an example of the sub word line driver 3 in more detail.

The sub word line driver 3 includes a first PMOS transistor P1 and first and second NMOS transistors N1 and N2.

The first PMOS transistor P1 includes a gate through which the main word line enable signal MWLB is received, a source to which the word line boosting signal PX is connected, and a drain to which the sub word line SWL is connected.

The first NMOS transistor N1 includes a gate through which the main word line enable signal MWLB is received, a source to which a ground voltage VSS is connected, and a drain to which the sub word line SWL is connected.

The second NMOS transistor N2 includes a gate through which the word line off signal PXB is received, a source to which a ground voltage VSS is connected, and a drain to which the sub word line SWL is connected.

FIG. 1c is a waveform diagram illustrating an operation of the sub word line driver 3 in detail.

First, during an active operation, when an active signal ACT is activated, the word line driving generator 1 activates the main word line enable signal MWLB to low and the word boosting signal PX to high. Thus, the word line off signal PXB is output in a deactivated state at the low level. The first PMOS transistor P1 of the sub word line driver 3 is turned on, such that the word line boosting signal PX at the high level is applied to the sub word line SWL.

In contrast, during a precharge operation, when the precharge signal PCG is activated, the word line driving generator 1 deactivates the main word line enable signal MWLB to high and the word boosting signal PX to low. Thus, the word line off signal PXB is set in an activated state at the high level. The first and second NMOS transistors N1 and N2 of the sub word line driver 3 are turned on, such that a voltage level of the sub word line SWL is pulled down to the ground voltage VSS.

Manufacturing defects, such as those pertaining to contacts, may occur in the transistors P1, N1, and N2 of the sub word line driver 3. According to the related art, in order to detect the manufacturing defect, the transistors P1, N1, and N2 are tested by enabling and disabling a sub word line SWL via an active or precharge operation.

However, as shown in section 'A' of FIG. 1c, when the precharge operation is performed, the main word line enable signal MWLB and the word line off signal PXB are simultaneously pulled up to the high level, so the first and second NMOS transistors N1 and N2 are turned on at the same time. Thus, it is difficult by the above test operation to check for example, whether only the second NMOS transistor N2, which discharges a voltage of a sub word line, is defective. Existence of this defective transistor would cause an unstable operation of a semiconductor memory apparatus, thus the importance of checking correct operation should be clear.

SUMMARY

In an embodiment of the present invention, a word line driving circuit includes a sub word line driver for using a word line boosting signal as a driving voltage and driving a sub word line in response to a main word line enable signal and a word line off signal, where a word line boosting signal and a main word line enable signal are activated during an active operation and a word line off signal is activated during a precharge operation in a normal mode, and the main word line enable signal is kept activated for a predetermined time during the precharge operation in a test mode.

In an embodiment of the present invention, a circuit for driving a word line includes: a word line driving signal generator configured to activate a word line boosting signal, a pre-main word line enable signal, and a word line off signal in response to an active signal and a precharge signal, a main word line enable signal controller configured to receive the pre-main word line enable signal to output a main word line enable signal in response to a main word line test mode signal, and a sub word line driver configured to drive a sub word line using the word line boosting signal as a driving voltage in response to the main word line enable signal and the word line off signal.

BRIEF DESCRIPTION OF THE DRAWINGS

Features, aspects, and embodiments are described in conjunction with the attached drawings, in which.

DETAILED DESCRIPTION

Hereinafter, a circuit for driving word lines according to the present invention will be described below with reference to the accompanying drawings through various embodiments.

Figure 2:
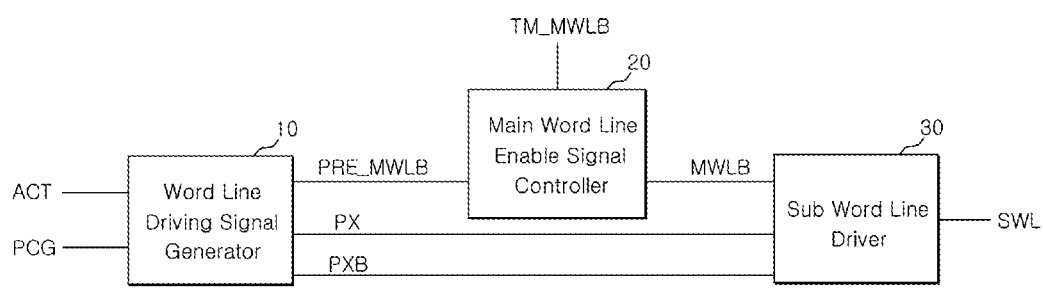
FIG. 2 is a block diagram illustrating a word line driving circuit according to an embodiment of the present invention.

FIG. 2 is a block diagram illustrating a word line driving circuit according to an embodiment of the present invention.

The word line driving circuit includes a word line driving signal generator 10, a main word line enable signal controller 20, and a sub word line driver 30.

The word line driving signal generator 10 receives an active signal ACT and a precharge signal PCG to generate a pre-main word line enable signal PRE_MWLB, a word line boosting signal PX and a word line off signal PXB.

The main word line enable signal controller 20 receives the pre-main word line enable signal PRE_MWLB and outputs it as a main word line enable signal MWLB in response to a main word line test mode signal TM_MWLB.

The sub word line driver 30 drives a sub word line SWL using the word line boosting signal PX as a driving voltage in response to the main word line enable signal MWLB and the word line off signal PXB.

As the main word line enable signal MWLB is a signal for selecting a main word line, the main word line enable signal MWLB includes as many plural signals as the number of main word lines. As the word line boosting signal PX and the word line off signal PXB are signals for selecting a sub word line, the word line boosting signal PX and the word line off signal PXB include as many plural signals as the number of sub word lines assigned to a corresponding main word line. By inverting the word line boosting signal PX, the word line off signal PXB can be generated. Multiple main word lines and sub word lines corresponding to applied multiple addresses are omitted, and instead one main word line and sub word line selected by an active signal ACT and a precharge signal PCG are depicted in FIG. 2. However, this can be applied to the multiple main word lines and sub word lines.

Figure 1A:
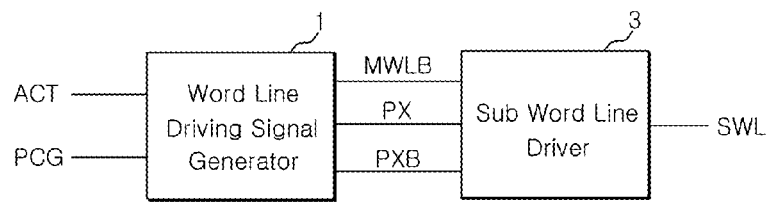
FIG. 1a is a block diagram illustrating a word line driving circuit of a related art.

The configuration and operation of the word line driving signal generator 10 are the same as those of the prior art. Referencing the prior art, a scheme for activating the pre-main word line enable signal PRE_MWLB, the word line boosting signal PX, and the word line off signal PXB can be implemented. The main word line enable signal MWLB generated from the word line driving signal generator 1 within the prior art depicted in FIGS. 1a to 1c corresponds to the pre-main word line enable signal PRE_MWLB depicted in FIG. 2. In the present invention as described above, the word line driving signal generator 10 generates the pre-main word line enable signal PRE_MWLB in order to distinguish between the pre-main word line enable signal PRE_MWLB from a final main word line enable signal MWLB, the latter which is directly applied to the sub word line driver after processing the pre-main word line enable signal PRE_MWLB.

During an active operation, when the activated active signal ACT is applied to the word line driving signal generator 10, the word line driving signal generator 10 activates the word line boosting signal PX and the pre-main word line enable signal PRE_MWLB. In comparison, during a precharge operation, when the activated precharge signal PCG is applied to the word line driving signal generator 10, the word line driving signal generator 10 deactivates the previously activated word line boosting signal PX and the previously activated pre-main word line enable signal PRE_MWLB and subsequently activates the word line off signal PXB. The word line boosting signal PX and the word line off signal PXB can both be activated by being set to high, and the pre-main word line enable signal PRE_MWLB and the main word line enable signal MWLB can both be activated by being set to low.

In a test mode, the main word line enable signal controller 20 receives the pre-main word line enable signal PRE_MWLB to output the main word line enable signal MWLB in response to a main word line test mode signal TM_MWLB.

The main word line test mode signal TM_MWLB is a signal which is activated when the active signal ACT is applied and a first predetermined time is lapsed in the test mode. The main word line test mode signal TM_MWLB is a signal which is applied to deactivate the main word line enable signal MWLB after performing an active operation. The main word line test mode signal TM_MWLB is deactivated again when the precharge signal PCG is applied and a second predetermined time is lapsed.

As in the prior art, the sub word line driver 30 drives the sub word line using the word line boosting signal PX as a driving voltage in response to the main word line enable signal MWLB and the word line off signal PXB. An embodiment of the present invention can be implemented with the sub word line driver 3 depicted in FIG. 1b.

An operation of the sub word line driver 30 will be briefly described below. When the main word line enable signal MWLB is activated and set to low, the voltage of the word line boosting signal PX which is activated and set to high is applied to a corresponding sub word line SWL, thus driving it. The main word line enable signal MWLB and the word line boosting signal PX are then activated, and when the word line off signal PXB is activated and set to high, the voltage of the sub word line SWL drops to ground.

Figure 1B:
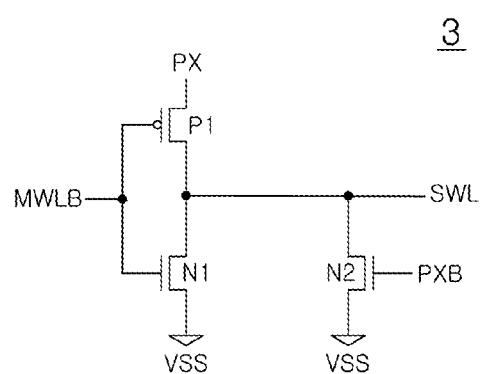
FIG. 1b is a circuit diagram illustrating an embodiment of the sub word line driver of FIG. 1a in detail.
Figure 1C:
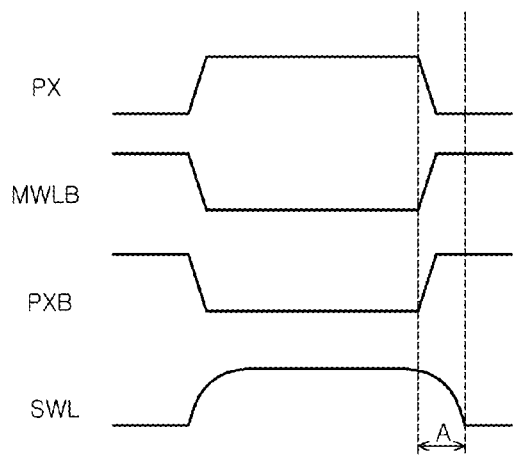
FIG. 1c is a waveform diagram illustrating an operation of the sub word line driver of FIG. 1a in detail.

Since the sub word line driver according to the prior art allows the main word line enable signal MWLB to be transferred into an inactive state and set to high when a precharge operation is performed after an active operation, the sub word line driver discharges the voltage of the sub word line SWL through the first and second NMOS transistors N1 and N2 depicted in FIG. 1b. However, since the sub word line driver 30 according to an embodiment of the present invention activates the main word line signal MWLB during a precharge operation, the sub word line driver 30 can discharge the sub word line SWL using only the second NMOS transistor N2 depicted in FIG. 1b. Thus, in the test mode, during the precharge operation, by detecting the voltage of the sub word line SWL, the circuit of FIG. 2 can be tested to determine whether the second NMOS transistor N2 is defective.

In the test mode, Since the first PMOS transistor P1 depicted in FIG. 1b can be driven because of the main word line enable signal MWLB maintaining the active state, by setting a driving power of the second NMOS transistor N2 depicted in FIG. 1b to be higher than that of the first PMOS transistor P1, a circuit can discharge the sub word line SWL substantially in the test mode.

Figure 3:
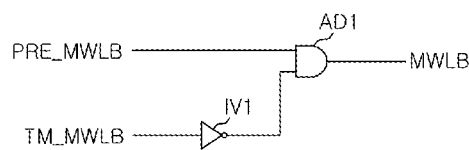
FIG. 3 is a circuit diagram illustrating an embodiment of the main word line enable signal controller of FIG. 2 in detail.

FIG. 3 is a circuit diagram illustrating in detail an example of a word line enable signal controller 20 according to an embodiment of the present invention.

The main word line enable signal controller 20 includes the first inverter IV1 and the first AND gate AD1.

The first inverter IV1 receives the main word line test mode signal TM_MWLB and outputs an inverted signal. The first AND gate AD1 receives the pre-main word line enable signal PRE_MWLB and the output of the first inverter IV1, conducts a logic AND, and outputs the result as the main word line enable signal MWLB.

When the deactivated main word line test mode signal TM_MWLB is applied to the main word line enable signal controller 20, the main word line enable signal controller 20 outputs the pre-main word line enable signal PRE_MWLB as the main word line enable signal MWLB. Thus, outside of test mode, the state of the main word line enable signal MWLB is determined according to the pre-main word line enable signal PRE_MWLB.

In contrast, when the activated main word line test mode signal TM_MWLB is applied, the activated main word line enable signal MWLB is output without taking the pre-main word line enable signal PRE_MWLB into consideration.

Thus in test mode, when the precharge operation is performed after the active operation, the main word line enable signal MWLB can remain in an active state.

Figure 4:
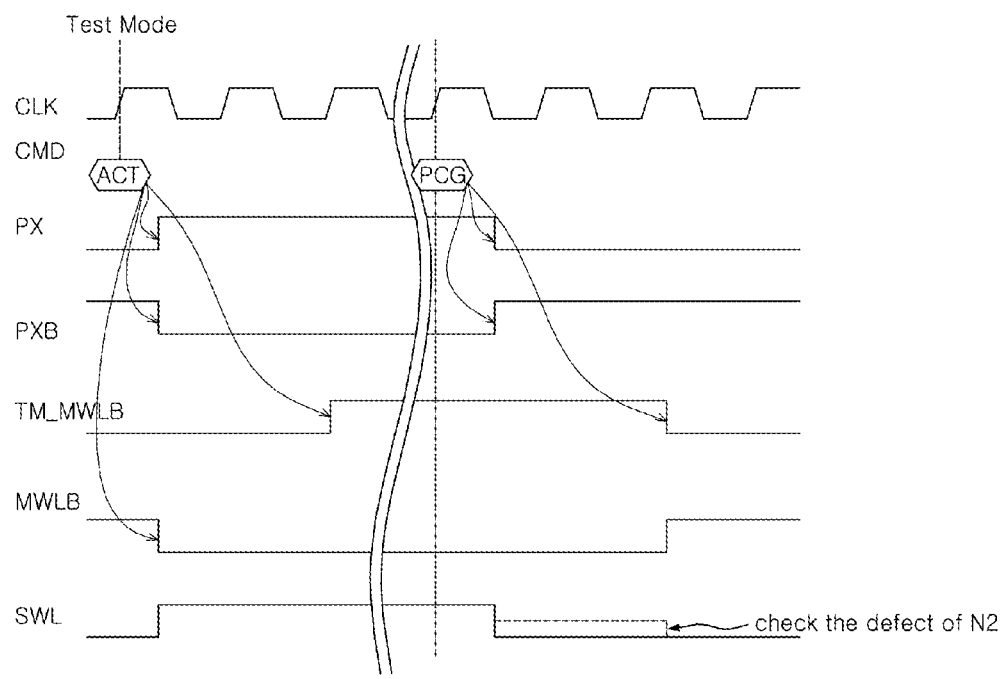
FIG. 4 is a waveform diagram illustrating an operation of the word line driving circuit of FIG. 2 in detail.

FIG. 4 is a waveform diagram illustrating in detail an operation of a word line driving circuit according to an embodiment of the present invention.

In the test mode, the active signal ACT is first applied. The word line boosting signal PX is activated and the word line off signal PXB is deactivated in response to the active signal ACT. The main word line enable signal MWLB is activated according to the activated pre-main word line enable signal PRE_MWLB. Thus, the corresponding sub word line SWL is selected.

In an early stage of the active operation, although the main word line test mode signal TM_MWLB is in an inactive state, when the active signal ACT is applied and the first predetermined time is lapsed, the main word line test mode signal TM_MWLB is activated. Thus, although the precharge signal PCG is applied, the main word line enable signal MWLB continuously remains in the active state.

When the precharge signal PCG is applied, the word line boosting signal PX is deactivated and the word line off signal PXB is activated. Until the precharge signal PCG is applied and the second predetermined time is lapsed, the main word line enable signal MWLB remains in an active state. Thus, if the second NMOS transistor N2 depicted in FIG. 1b is a properly operating device, the sub word line SWL is discharged, and if the second NMOS transistor N2 is defective, the sub word line SWL is not normally discharged. During the precharge operation, by detecting a voltage level of the sub word line, the circuit can be tested to determine whether the second NMOS transistor N2 of the sub word line driver is defective.

While certain embodiments have been described above, it will be understood by those skilled in the art that the embodiments described are by way of example only. Accordingly, the circuit for driving word lines described herein should not be limited based on the described embodiments. Rather, the circuit for driving word lines described herein should only be limited in light of the claims that follow when taken in conjunction with the above description and accompanying drawings.

What is claimed is:

1. A circuit for driving a word line, comprising:
a word line driving signal generator configured to activate a word line boosting signal, a pre-main word line enable signal, and a word line off signal in response to an active signal and a precharge signal;
a main word line enable signal controller configured to receive the pre-main word line enable signal in response to a main word line test mode signal to output a main word line enable signal; and
a sub word line driver including a first PMOS transistor having a gate through which the main word line enable signal is received, a source to which the word line boosting signal is connected, and a drain to which the sub word line is connected; a first NMOS transistor having a gate through which the main word line enable signal is received, a source to which a ground voltage is connected, and a drain to which the sub word line is connected; and a second NMOS transistor having a gate through which the word line off signal is received, a source to which a ground voltage is connected, and a drain to which the sub word line is connected,
wherein a driving power of the second NMOS transistor is set to be greater than a driving power of the first PMOS transistor, so that when a main word line test mode signal is activated, the sub word line can be discharged.

2. The circuit according to claim 1,
wherein the word line driving signal generator activates both the word line boosting signal and the pre-main word line enable signal when an activated active signal is applied, and
wherein the word line driving signal generator deactivates both the activated word line boosting signal and the activated pre-main word line enable signal and activates the word line off signal when an activated precharge signal is applied.

3. The circuit according to claim 1, wherein the main word line enable signal controller outputs the pre-main word line enable signal as the main word line enable signal when a deactivated main word line test mode signal is applied.

4. The circuit according to claim 3, wherein the main word line enable signal controller outputs an activated main word line enable signal when an activated main word line test mode signal is applied.

5. The circuit according to claim 4, wherein the main word line test mode signal is activated when a first predetermined time has lapsed after the active signal is applied in a test mode.

6. The circuit according to claim 5, wherein the main word line test mode signal is deactivated when a second predetermined time has lapsed after the precharge signal is applied in the test mode.

7. The circuit according to claim 1, wherein the main word line enable signal controller comprises a first AND gate configured to receive the inverted main word line test mode signal and the pre-main word line enable signal to output the main word line enable signal.

8. The circuit according to claim 7, wherein the main word line test mode signal is activated when a first predetermined time has lapsed after the active signal is applied in a test mode.

9. The circuit according to claim 8, wherein the main word line test mode signal is deactivated when a second predetermined time has lapsed after the precharge signal is applied in the test mode.

10. A sub word line driver, comprising:
   a first PMOS transistor configured to be connected between a word line boosting signal terminal and an output node and to be driven when a main word line enable signal is enabled;
   a first NMOS transistor configured to be connected between the output node and a ground terminal and to be driven when the main word line enable signal is disabled; and
   a second NMOS transistor configured to be connected between the output node and the ground terminal and to be driven in response to a word line off signal,
   wherein the main word line enable signal is enabled in order that the first PMOS transistor is driven, a voltage signal of the word line boosting terminal is deactivated and the word line off signal is enabled to be driven the second NMOS transistor, while a main word line test mode signal is activated.

11. The sub word line driver according to claim 10, wherein the main word line enable signal is generated using the main word line test mode signal, an active signal and a precharge signal.

12. The sub word line driver according to claim 10, wherein defect of the second NMOS transistor is checked while the word line off signal is temporarily activated and the main word line test mode signal is activated.

13. The sub word line driver according to claim 10, wherein a driving power of the second NMOS transistor is set to be greater than a driving power of the first PMOS transistor.

* * * * *